United States Patent [19]

Wiesner

[11] 3,745,648

[45] July 17, 1973

[54] METHOD FOR MOUNTING SEMICONDUCTOR COMPONENTS

[75] Inventor: Richard Wiesner, 8011 Neukeferloh, Germany

[73] Assignee: Siemens Aktiengesellschaft, Berlin, Germany

[22] Filed: Mar. 18, 1970

[21] Appl. No.: 20,519

[30] Foreign Application Priority Data

Mar. 26, 1969 Germany .................. P 19 15 501.2

[52] U.S. Cl. ........................ 29/580, 29/589, 29/588

[51] Int. Cl. ............................................ B01j 17/00

[58] Field of Search .................. 29/576 S, 580, 627, 29/588; 174/3 FP, 3 HS; 317/234 N

[56] References Cited

UNITED STATES PATENTS

| | | | |
|---|---|---|---|
| 3,271,625 | 9/1966 | Caracciolo | 29/576 S |
| 3,317,287 | 5/1967 | Caracciolo | 29/193 |
| 3,390,308 | 6/1968 | Marley | 174/3 FP |
| 3,559,285 | 2/1971 | Kauffman | 317/234 N |
| 3,374,537 | 3/1968 | Doelp | 29/627 |

*Primary Examiner*—Charles W. Lanham

*Assistant Examiner*—W. Tupman

*Attorney*—Curt M. Avery, Arthur E. Wilfond, Herbert L. Lerner and Daniel J. Tick

[57] ABSTRACT

Method of connecting an integrated circuit with outside electrical leads. The integrated circuit is inserted into an insulating substrate upon which electrical conductance paths are located. An electrical connection is established between the conductor paths on the substrate and the integrated circuit. A hole is etched into the substrate so that the inside ends of the conductor paths protrude freely beyond the edge of the hole. The integrated circuit is inserted into said hole and the ends of the conductor paths extending beyond the edge of the hole establish electrical contact with respective places of the integrated circuit.

5 Claims, 3 Drawing Figures

METHOD FOR MOUNTING SEMICONDUCTOR COMPONENTS

My invention relates to a method for connecting an integrated circuit with outside electric leads. The integrated circuit is inserted into an insulating substrate provided with electrical conductor paths located thereon and an electrical connection is established between the conductor paths on the substrate and the integrated circuit.

According to known methods, integrated circuits are inserted into a substrate with conductor paths which are exposed by etching at the circuit. Thus, "The Western Electric Engineer" of December 1967, pages 16 to 26, describes the connection of an integrated circuit with outside leads, according to the beam-lead method. According to this method, the conductor paths are attached directly to the integrated circuit, for example by vapor deposition and the electrical contact is established with the outside leads outside the integrated circuit, via the conductor paths. To this end, it is necessary to expose the conductor paths at the integrated circuit by etching, so that they extend freely beyond the edge of the substrate of the integrated circuit. This method of etching requires great exactness and is therefore hard to put into effect. Furthermore, the conductor paths need space on the integrated circuit if they are first affixed there. This is in contradistinction to the intended goal which is the objective of the integrated circuit, that is to accommodate as many components as possible in the smallest possible area. Integrated circuits with protruding conductor paths are also hard to handle, since they are vulnerable to mechanical damages.

Other methods are known where the connection between the integrated circuit and its outer leads is effected via thin wires. To this end, each individual wire must be affixed to the lead as well as to the integrated circuit which involves a great number of method steps. A connection effected via contact wires is therefore expensive and difficult to effect.

It is thus the object of the invention to provide a method which affords the establishment of a simple contact without contacting wires, between an integrated circuit and outside leads. The advantages associated with the beam lead method are to be utilized to a great extent.

To this end and in accordance with the invention, an insulating material is used as a substrate which lends itself to etching so that a hole is etched into said substrate in a manner whereby the inside ends of the conductor paths protrude freely across the edge of the hole into which the integrated circuit is placed and the ends of the conductor paths, which extend beyond the edge of the hole, are electrically connected with respective places of the integrated circuit.

According to my invention it is preferable to place the conductor paths upon the insulated substrate. This eliminates the difficult etching process, which must be effected in order to expose said conductor paths at the integrated circuit, directly. The dimensioning of the hole whereinto the integrated circuit is inserted, need not be very exact. Also, a small amount of space is required for the conductor paths on the integrated circuit, since the contacts between the integrated circuit and the conductor paths serve only to establish an electrical connection and are not needed for affixing the freely protruding conductor paths.

Other features and details of the invention will be seen from the following embodiments, which make reference to the drawing, wherein.

An insulating substrate is provided with conductor paths 2 according to the known vapor deposition or galvanic methods. The conductor paths can be gold. These conductor paths are subsequently exposed by etching to form a hole 3 in the insulating substrate 1. The dimensioning of the hole 3 does not require great exactness. Contacts 5 are attached to the end of the substrate 1 at the ends of the conductor paths 2 which are turned away from the integrated circuit 4 by soldering, welding or thermocompression. An integrated circuit 4 is placed into said hole 3 and may be soldered, for example, to the conductor paths 2. It is essential that the insulator which defines the substrate 1 is easily etched. It is especially preferred to use glass or oxidized silicon, for the substrate.

Figure 1:
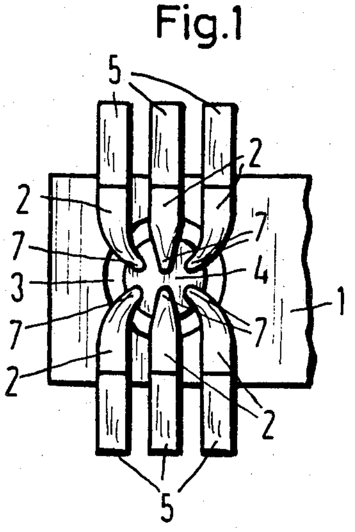
FIG. 1 is a plan view upon an insulating substrate with a bound integrated circuit whereby a heat conducting electrical insulator had been omitted.
Figure 2:
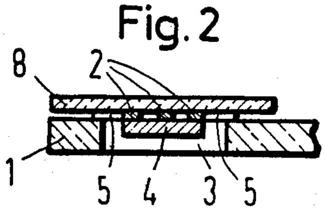
FIG. 2 is a cross section through FIG. 1 and the heat conducting electrical insulator is illustrated in a first embodiment.
Figure 3:
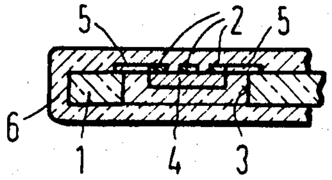
FIG. 3 is a cross section through the object of FIG. 1 and the heat conducting electrical insulator is shown in a second embodiment.

Another preferred feature of the invention is that the entire arrangement be cast with a heat conducting electrical insulator, or be cemented therewith. It is possible to cast the hole 3 with the inserted integrated circuit, with a material 6 having good thermal conductivity (FIG. 3). It is also possible and expedient to paste a plate 8 upon the surface of the entire device. This plate 8 not only conducts heat but also provides electrical insulation (FIG. 2). This feature insures a good removal of the dissipated heat which occurs in the integrated circuit. It is advantageous to use the same material for the conductor paths 2 that was employed for the contact surfaces or points 7 of the integrated circuit. This affords the possibility for a simple welding between the integrated circuit with the conductor paths. The occurrence of thermal tensions is furthermore prevented.

I claim:

1. A method of connecting an integrated circuit with outside electrical leads, whereby the integrated circuit is inserted into an insulating substrate upon which electrical conductance paths are vapor deposited or galvanically precipitated and an electrical contact is established between the conductor paths on the substrate and the integrated circuit, which comprises using as a substrate a single layer of an insulating material which can be etched, vapor depositing or galvanically precipitating conductance paths directly on a surface of said substrate, etching a hole into said substrate so that the inside ends of the conductor paths protrude freely in an unsupported manner beyond the edge of the hole, inserting the integrated circuit into the hole and electrically and mechanically contacting the ends of the conductor paths extending beyond the edge of the hole with respective places of the integrated circuit.

2. The method of claim 1, wherein the substrate material is glass.

3. The method of claim 1, wherein oxidized silicon is the substrate material.

4. The method of claim 1, wherein the insulating substrate with the inserted integrated circuit, which is connected with the ends of the conductor paths which extend beyond the edge of the hole, is enclosed with a heat conducting insulator.

5. The method of claim 1, wherein the substrate, which contains the conductor paths is provided with a heat conducting electricity insulating plate which is pasted upon said substrate.

* * * * *